United States Patent
Gibbs et al.

(10) Patent No.: US 6,788,538 B1
(45) Date of Patent: Sep. 7, 2004

(54) RETENTION OF HEAT SINKS ON ELECTRONIC PACKAGES

(75) Inventors: Ronald T. Gibbs, Paoli, PA (US); Grant M. Smith, Bryn Athyn, PA (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 10/390,244

(22) Filed: Mar. 17, 2003

(51) Int. Cl.$^7$ ................................................ H05K 7/20
(52) U.S. Cl. .................... 361/704; 361/707; 361/709; 165/80.3; 165/185; 174/16.1; 174/16.3; 257/718; 257/727
(58) Field of Search ................................ 361/702, 704, 361/707, 719; 257/718, 727; 174/16.1, 16.3; 165/80.3; 24/296, 457

(56) References Cited

U.S. PATENT DOCUMENTS

| | | | | |
|---|---|---|---|---|
| 5,241,453 A | * | 8/1993 | Bright et al. | 361/704 |
| 5,251,101 A | * | 10/1993 | Liu | 361/717 |
| 5,323,845 A | * | 6/1994 | Kin-shon | 165/80.3 |
| 5,371,652 A | * | 12/1994 | Clemens et al. | 361/704 |
| 5,448,449 A | * | 9/1995 | Bright et al. | 361/704 |
| 5,734,556 A | * | 3/1998 | Saneinejad et al. | 361/719 |
| 5,917,700 A | * | 6/1999 | Clemens et al. | 361/704 |
| 5,982,620 A | * | 11/1999 | Lin | 361/704 |
| 5,990,552 A | * | 11/1999 | Xie et al. | 257/718 |

* cited by examiner

*Primary Examiner*—Boris Chervinsky
(74) *Attorney, Agent, or Firm*—Lise A. Rode; Mark T. Starr; RatnerPrestia

(57) ABSTRACT

A structure for removing heat from a packaged electronic component. The structure includes three, main elements. First, a heat sink has a pedestal with opposing ends and a plurality of fins separated by spaces and disposed on the pedestal. The heat sink dissipates heat generated by the packaged electronic component. Second, parallel rails are disposed adjacent the opposing ends of the pedestal, each rail having a catch. Third, a spring clip has (a) end hooks which engage the catches to retain the spring clip on the rails, and (b) a strut extending between the hooks, fitting into the space between adjacent fins, and including an apex which contacts substantially centrally the pedestal and applies a force pressing the heat sink toward the packaged electronic component. Thus, the heat sink is removably attached at least indirectly to the packaged electronic component. Also disclosed is a method of using the structure.

18 Claims, 12 Drawing Sheets

SINGLE PACKAGE FRAME

SPRING

SINGLE PACKAGE FRAME

SPRING

SIDE TRANSPARENT VIEW SHOWING RAILS HEAT SINK AND SPRING ASSEMBLED

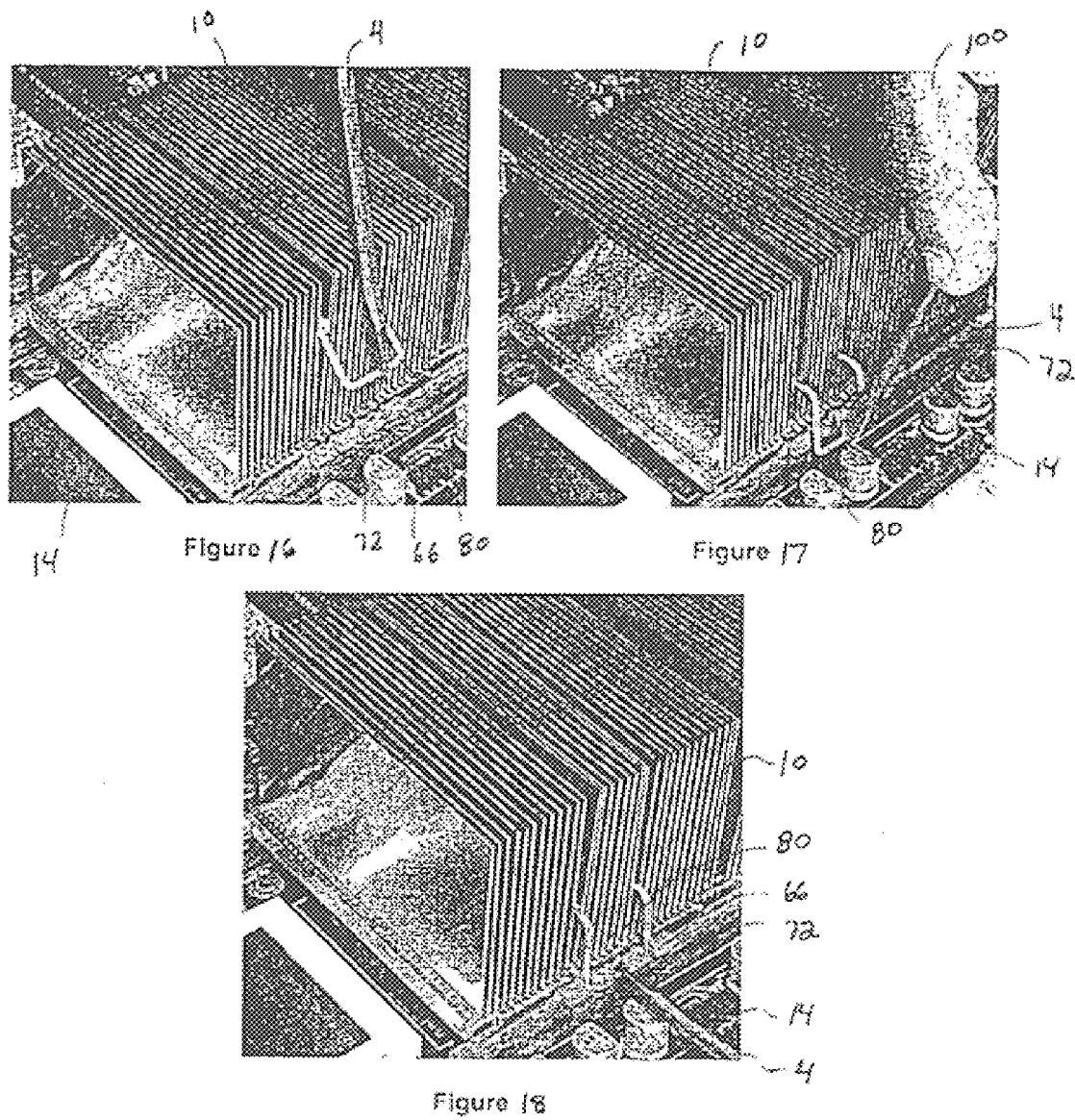

RETENTION OF HEAT SINKS ON ELECTRONIC PACKAGES

FIELD OF THE INVENTION

The present invention relates generally to semiconductor device packaging and, in particular, to a structure and method for removably attaching a heat sink to an electronic package which is, even more particularly, a surface mount package.

BACKGROUND OF THE INVENTION

In order to safely operate modem computers and other electronic devices, thermal energy must be removed from components which generate large amounts of heat and which cannot dissipate the heat fast enough to avoid harmful consequences. As the art moves towards smaller, higher-power integrated circuits such as static random access memory (SRAM) integrated circuits, heat transfer from the integrated circuit package (IC package) becomes increasingly difficult and more important. (The term "IC package" includes the heat-generating integrated circuit as well as the packaging surrounding the integrated circuit.) As chip density and the speed of IC chips increase, chips often require high-performance surface mount packages assembled very close to each other on circuit cards. These packages generate heat and, because they are packed very close to each other, they become hot.

One conventional method used to dissipate the accumulating heat of an electronic device such as an IC package is to force air over the device, thereby removing the heat by convection. This method has been substantially improved by attaching a heat dissipating device, also known as a heat sink, to the electronic device. The heat sink is designed to dissipate heat at a significantly greater rate than the electronic device alone. A heat sink typically has projections such as pins or fins, exposing a greater surface area to the flow of air for greater dissipation of heat.

When the heat sink is placed in thermal contact with the electronic device, the electronic device transfers heat by conduction to the heat sink. The heat to sink then dissipates accumulating heat by convection to the ambient environment. This method has become standard in the computer industry for dissipating the large amounts of heat generated by the new generation of computer processors.

Of importance, the heat sink must be reliably attached to the electronic device. In the case of IC packages, such attachment must not undesirably is stress or damage the IC package or the circuit board to which the IC package is connected. One conventional technique is to employ a thermally conductive adhesive which bonds the heat sink to the IC package. Thermally conductive adhesives do not adhere well to plastic IC packages, however, resulting in an unacceptably high incidence of bond failure between the plastic IC package and the heat sink. Further, once the heat sink is bonded with the thermally conductive adhesive, it is difficult to remove the heat sink from the IC package without causing damage to the IC package, the heat sink, or the circuit board. Still further, it is desirable to have a removable heat sink to readily allow chip repair, rework, or replacement. Accordingly, it is preferable to avoid the use of thermally conductive adhesives altogether.

Other methods have been used to secure the heat sink to the electronic device, including the use of clips to fasten the assembly together. It is preferred that any attachment method allow for quick and easy installation and removal of the heat sink while providing a secure attachment during operation and normal handling. Electronic devices must be removed and replaced from time to time; therefore, the heat sink must be easy to remove and install without sacrificing reliability or effectiveness. Clips offer the advantages of being relatively inexpensive, simple, operational over a multiple number of assembles and disassembles, and reasonably secure so that the heat sink does not disconnect or dislodge from the electronic device.

A wide variety of different clips are known. Two-piece dips are disclosed by U.S. Pat. No. 5,617,292 issued to Steiner. As Steiner teaches, however, previous two-piece clips used to fasten heat sinks generally lack sufficient rigidity and strength, particularly at the junction between the two parts of the clip, and separation of the assembly is a potential risk. In general, two-piece clips are constructed so that the intersection of the separate leg and the leaf spring member forms a loose hinge about which rotation at least to some degree in several directions is possible. Thus, the force holding the assembly together is exerted substantially entirely in a direction normal to the electronic component. The hinge mechanism is relatively weak and prone to failure, particularly under prolonged use and shock and vibration. Holding the necessary tolerances during manufacturing imposes additional difficulty in producing two-piece clips.

One-piece clips avoid some of the drawbacks inherent in two-piece clips. Such clips generally extend over the heat sink and attach at each end to the electronic device or its socket at specially provided ports or bosses. Clips of this design require modification of the electronic device or its socket and may deleteriously affect performance of those components. To avoid these problems, other clips attach removable heat sinks directly to the circuit board to which the IC package is connected.

For example, Tseng discloses, in U.S. Pat. No. 6,043,984 assigned to Intel Corporation, a removable heat sink that uses clips or fasteners to attach the heat sink to an IC package. The IC package is mounted to a substrate such as a circuit board. The clip has four L-shaped ears that are inserted through clearance holes in the substrate and corresponding attachment holes in the heat sink. The four L-shaped ears extend from a center plate portion. The L-shaped ears are bent during insertion through the holes. Once beyond the attachment holes of the heat sink, the L-shaped ears snap back so as to permit the clip to exert a spring force that pushes the heat sink into the integrated circuit package.

As described in U.S. Pat. No. 6,154,365, also assigned to Intel Corporation, the clip taught by Tseng has several drawbacks. From one electrical assembly to the next, the spring force from the L-shaped ears is not consistent due to the variations within part manufacturing tolerances. Moreover, the L-shaped ear technique does not permit a technician to adjust the spring force from the L-shaped ears so as to evenly distribute this force over the surface of the substrate. Without an even distribution of force, the substrate is more likely to bend which may cause the substrate or the integrated circuit within the integrated circuit package to crack. When attached directly to the IC package in the manner disclosed, the heat sink exerts undue force on the IC package which can damage and ultimately destroy the IC package.

Post-type fastening members are also used to secure a heat sink to an electronic device. FIG. 1 is a side view of an electronic device 8 which includes a heat sink 10 directly attached by post-type fastening members 12A to a circuit board 14. Located between the heat sink 10 and the circuit board 14 is an IC package 16 which generates heat during use. The IC package 16 is typically electrically connected to the circuit board 14 by one or more circuit interconnections, e.g., solder, which are not illustrated in FIG. 1 for purposes of clarity. The fastening members 12A urge the heat sink 10 towards the circuit board 14 and down onto the IC package 16 to make the thermal contact between the heat sink 10 and the IC package 16.

Although providing the force necessary to make the thermal contact between the heat sink 10 and the IC package 16, the fastening members 12A cause the heat sink 10 to press unevenly on the IC package 16. In particular, the IC package 16 acts as a pivot between the heat sink 10 and the circuit board 14 so that the end 10A of the heat sink 10 is urged away from the end 14A of the circuit board 14 as indicated by the arrows 18. This causes the force exerted by the heat sink 10 on the IC package 16 to be greater at the side 16A of the IC package 16 than at the side 16B. This uneven force distribution can damage and even crack the IC package 16. Further, this uneven force distribution can create a gap between the side 16B and the heat sink 10 resulting in poor heat transfer between the IC package 16 and the heat sink 10. Alternatively, or in addition, this uneven force distribution can cause circuit interconnection failure near the side 16B of the IC package 16. As those skilled in the art understand, these conditions can ultimately cause failure of the device 8.

To avoid these drawbacks, it has become known in the art to attach both sides of the heat sink 10 to the circuit board 14. As an example, second post-type fastening members 12B illustrated by dashed lines in FIG. 1 can be employed. This tends to equalize the force exerted by the heat sink 10 on both the sides 16A and 168 of the IC package 16. This also causes the ends 14A, 14B of the circuit board 14 to be pulled up, however, by the fastening members 12B, 12A, respectively, relative to the die attach region 14C of the circuit board 14 to which the IC package 16 is attached. This bending force, indicated by arrows 20, causes the circuit board 14 to warp such that the circuit board 14 is displaced to a position 22. Over time, such bending can cause the device 8 to fail, e.g., from failure of circuit interconnections between the IC package 16 and the circuit board 14. U.S. Pat. No. 6,125,037, issued to Bollesen, discusses the post-type fastening members illustrated in FIG. 1 and described above.

FIG. 2 shows a product designed by Intel Corporation illustrating still another mechanism used to secure a heat sink to an electronic device. As with many electronic packages used in the computer industry, the Intel product includes a layered region of five stacked components: (1) a circuit board 14, (2) a socket 30, (3) a processor (not shown), (4) a thermal pad (also not shown), and (5) a heat sink 10 designed to dissipate heat generated by the processor. The heat sink 10 is retained in position over the processor, for the illustrated structure available from Intel, by a pair of retention modules 40 placed alongside two opposing sides of the heat sink 10. Two screws 42 engage mating screw holders 44 in the circuit board 14 to affix each retention module 40 in position. A spring clip 46 fits over each retention module 40 and exerts a downward force on an edge portion of the heat sink 10, peripheral to the cooling fins of the heat sink 10, to retain the heat sink 10.

Thus, the conventional Intel structure requires multiple components. The Intel structure specifically requires two retention modules 40, four screws 42, four screw holders 44, and two spring clips 46. The spring clips 46 require a separate tool for assembly and disassembly. When the first spring clip 46 is assembled, the downward force exerted on an edge of the heat sink 10 pivots upward the unrestrained opposite side of the heat sink 10. Such pivoting action may damage the interface (typically a thermally conductive pad, grease, or oil) between the heat sink 10 and the processor.

To overcome the shortcomings of conventional mechanisms, a new device and method for retaining heat sinks on electronic devices such as IC packages is provided. An overall object of the present invention is to provide an improved heat sink retention structure and method. Another object is to reduce the space occupied by the retention structure on the underlying electronic package.

Still another object is to ease the assembly and disassembly of the heat sink. A related object is to eliminate some of the components required by conventional retention structures, including separate tools for assembly and disassembly. Additional objects of the present invention are to locate the retention force substantially centrally on the heat sink or in the region of the fins of the heat sink and to distribute the force evenly. It is still another object to avoid possible damage to the package or thermal interface material during assembly and disassembly of the heat sink. Yet another object of this invention is to provide stiffness to and avoid bending of the circuit board which underlies the heat sink. Also an object is to minimize the disruption of air flow through the heat sink.

SUMMARY OF THE INVENTION

To achieve these and other objects, and in view of its purposes, the present invention provides a structure for removing heat from a packaged electronic component. The structure includes three, main elements. The first element is a heat sink having a pedestal with opposing ends and a plurality of fins separated by spaces and disposed on the pedestal. The heat sink dissipates heat generated by the packaged electronic component. The second element is a set of parallel rails disposed adjacent the opposing ends of the pedestal of the heat sink, each rail having a catch. The third element is a spring clip having (a) end hooks which engage the catches on the rails to retain the spring dip on the rails, and (b) a strut extending between the hooks, fitting into the space between adjacent fins of the heat sink, and including an apex which contacts substantially centrally the pedestal of the heat sink and applies a force pressing the heat sink toward the packaged electronic component. Thus, the heat sink is removably attached at least indirectly to the packaged electronic component.

The present invention further provides an electronic package. The electronic package includes a circuit board; a socket affixed to the circuit board; a processor fitted in the socket and generating heat; a thermal pad engaging the processor and transmitting the heat generated by the processor; a heat sink having a pedestal with opposing ends and a plurality of fins separated by spaces and disposed on the pedestal, the heat sink engaging the thermal pad and dissipating the heat generated by the processor and transmitted by the thermal pad; and an attachment structure removably attaching the heat sink to the thermal pad. The attachment structure includes: (a) parallel rails disposed adjacent the opposing ends of the pedestal of the heat sink, each rail having a catch, and (b) a spring clip having (1) end hooks which engage the catches on the rails to retain the spring clip on the rails and (ii) a strut extending between the hooks, fitting into the space between adjacent fins of the heat sink, and including an apex which contacts substantially centrally the pedestal of the heat sink and applies a force pressing the heat sink toward the thermal pad.

The present invention still further provides a method of removably attaching a heat sink to a packaged electronic component whereby the heat sink dissipates heat generated by the packaged electronic component. The heat sink has a pedestal with opposing ends and a plurality of fins separated by spaces and disposed on the pedestal. The method includes arranging parallel rails adjacent the opposing ends of the pedestal of the heat sink, each rail having a catch. A spring clip is installed pursuant to the method. The spring clip has (a) end hooks which engage the catches on the rails to retain the spring clip on the rails, and (b) a strut extending between the hooks, fitting into the space between adjacent fins of the heat sink, and including an apex which contacts substantially centrally the pedestal of the heat sink and applies a force pressing the heat sink toward the packaged electronic component. Thus, the heat sink is removably attached at least indirectly to the packaged electronic component.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIG. 16 illustrates another step of the procedure used to assemble the components shown in FIG. 12 in which a downward pressure is applied to a hook of the spring clip;

FIG. 17 illustrates another step of the procedure used to assemble the components shown in FIG. 12 in which the hook of the spring clip is pushed down past the corresponding catches in the rail;

FIG. 18 illustrates another step of the procedure used to assemble the components shown in FIG. 12 in which the hook of the spring clip is pushed under the catches in the rail to complete installation.

DETAILED DESCRIPTION OF THE INVENTION

Figure 1:
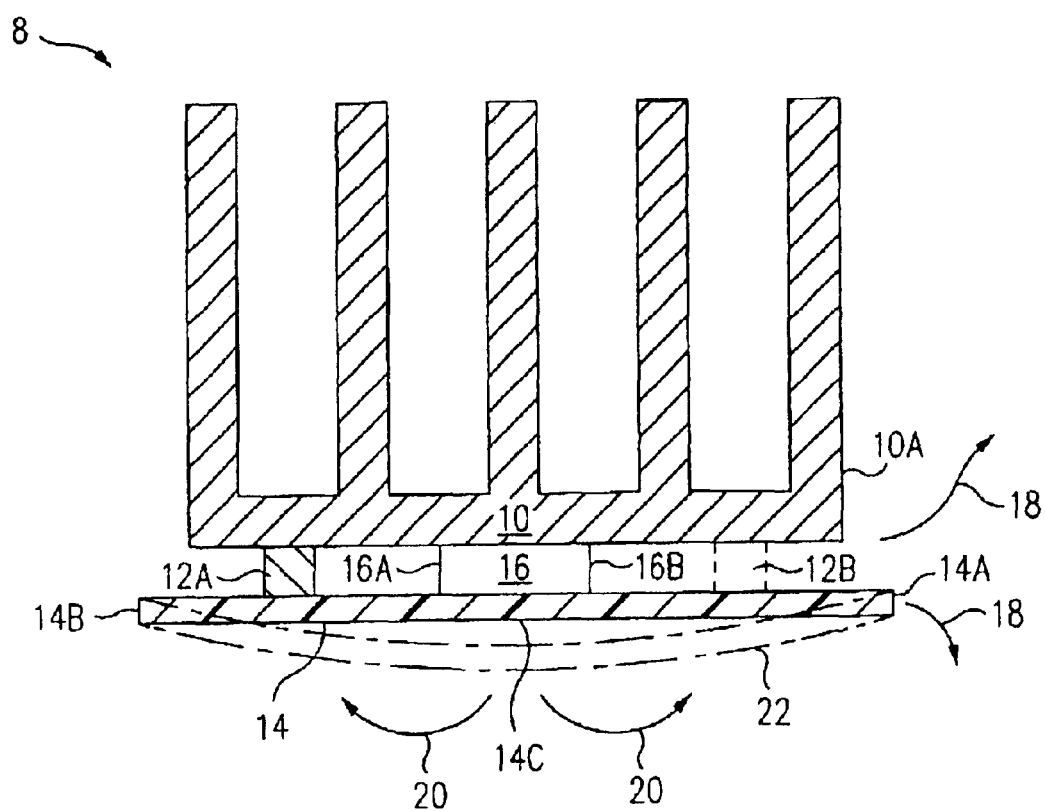
FIG. 1 is a side view of an electronic device which includes a heat sink directly attached by post-type fastening to a circuit board in accordance with a conventional structure.
Figure 2:
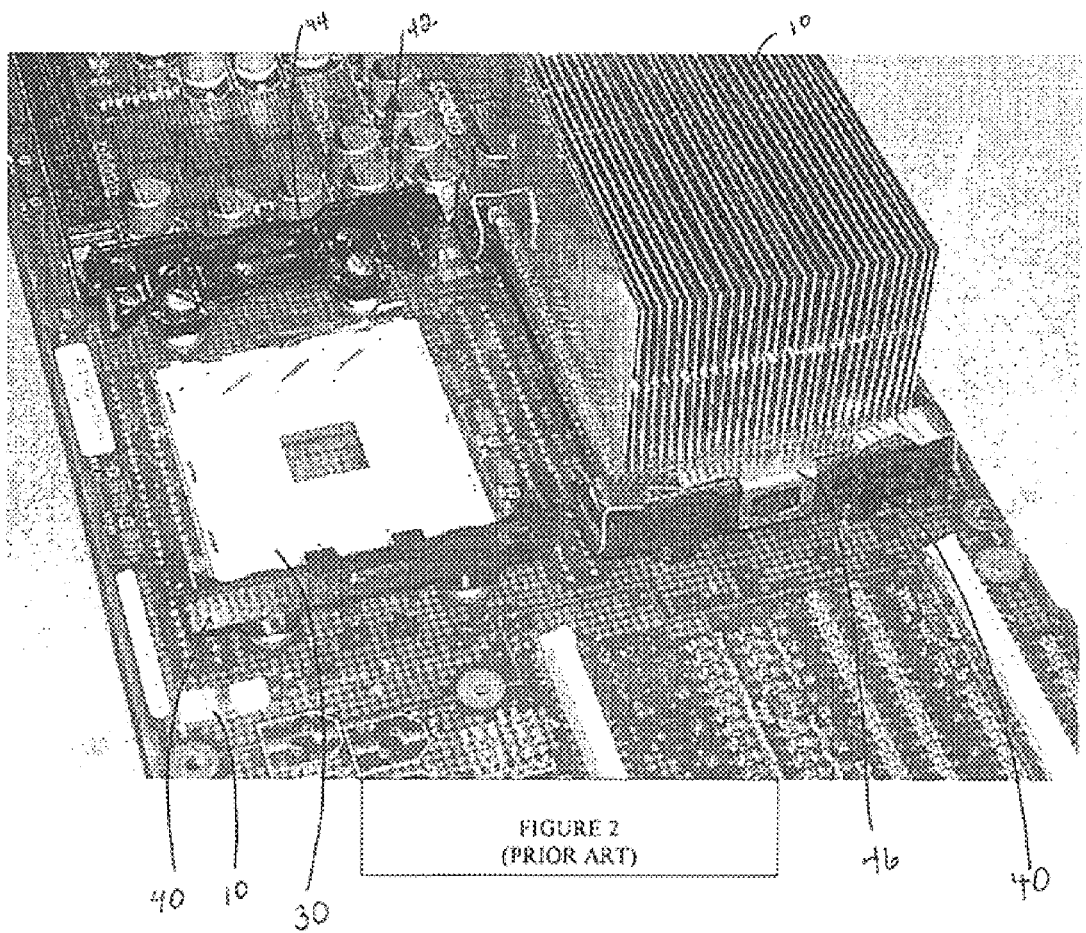
FIG. 2 shows a product marketed by Intel Corporation illustrating still another conventional mechanism used to secure a heat sink to an electronic device.
Figure 3:
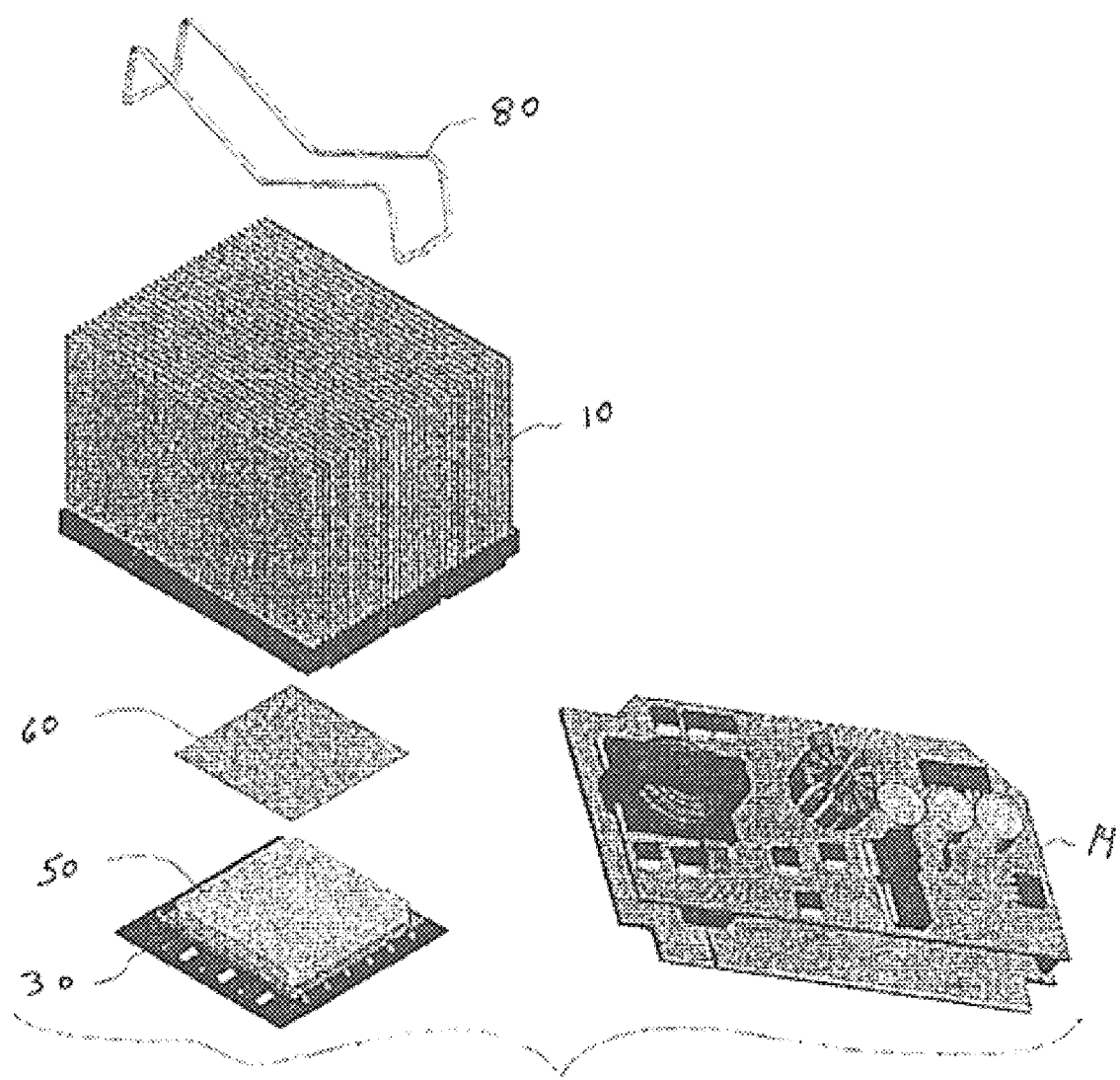
FIG. 3 is separated view showing several of the components used in an exemplary embodiment of the structure of the present invention.

Referring now to the drawing, in which like reference numbers refer to like elements throughout the various figures that comprise the drawing, FIG. 3 shows a structure as manufactured pursuant to the invention. The structure includes five stacked components: (1) a circuit board 14, (2) a socket 30, (3) a processor 50, (4) a thermal pad 60, and (5) a heat sink 10 designed to dissipate heat generated by the processor 50. The heat sink 10 must be retained in position over the processor 50 and on the thermal pad 60. A spring clip 80 is provided to achieve that function.

A. Structure of the Invention

The integrated circuits of the processor 50 generate heat which must be removed from the circuits. The thermal pad 60 is thermally coupled to the integrated circuit package to provide a thermal path for the heat generated by the processor 50. Rather than a thermal pad 60, any of the known interfaces may be used between the heat sink 10 and the processor 50. Such interfaces include thermally conductive greases or oils; an exception is any material that also acts as an adhesive.

The heat sink 10 is mounted to the thermal pad 60 to further facilitate the removal of heat. The heat sink 10 typically contains a plurality of fins 24 which extend from a pedestal 26. The pedestal 26 has a mounting surface 28 which mates with a corresponding surface of the thermal pad 60. The mounting surfaces of the thermal pad 60 and the heat sink 10 must be relatively flat to ensure that there are no air voids when the components are assembled. Air voids will significantly increase the thermal impedance between the thermal pad 60 and the heat sink 10.

Figure 4:
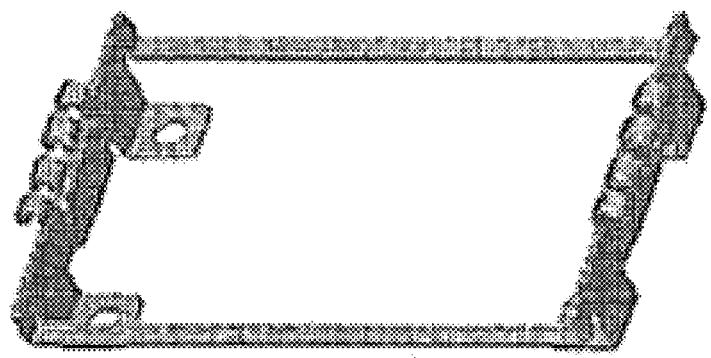
FIG. 4 illustrates a first embodiment of the support structure of the present invention, which is typically used to support a single IC package, having a frame with a pair of parallel rails.
Figure 5:
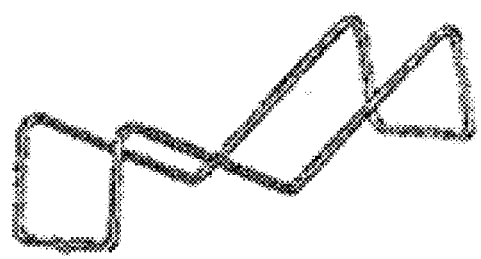
FIG. 5 is a perspective view of an exemplary embodiment of the spring clip according to the present invention.
Figure 6:
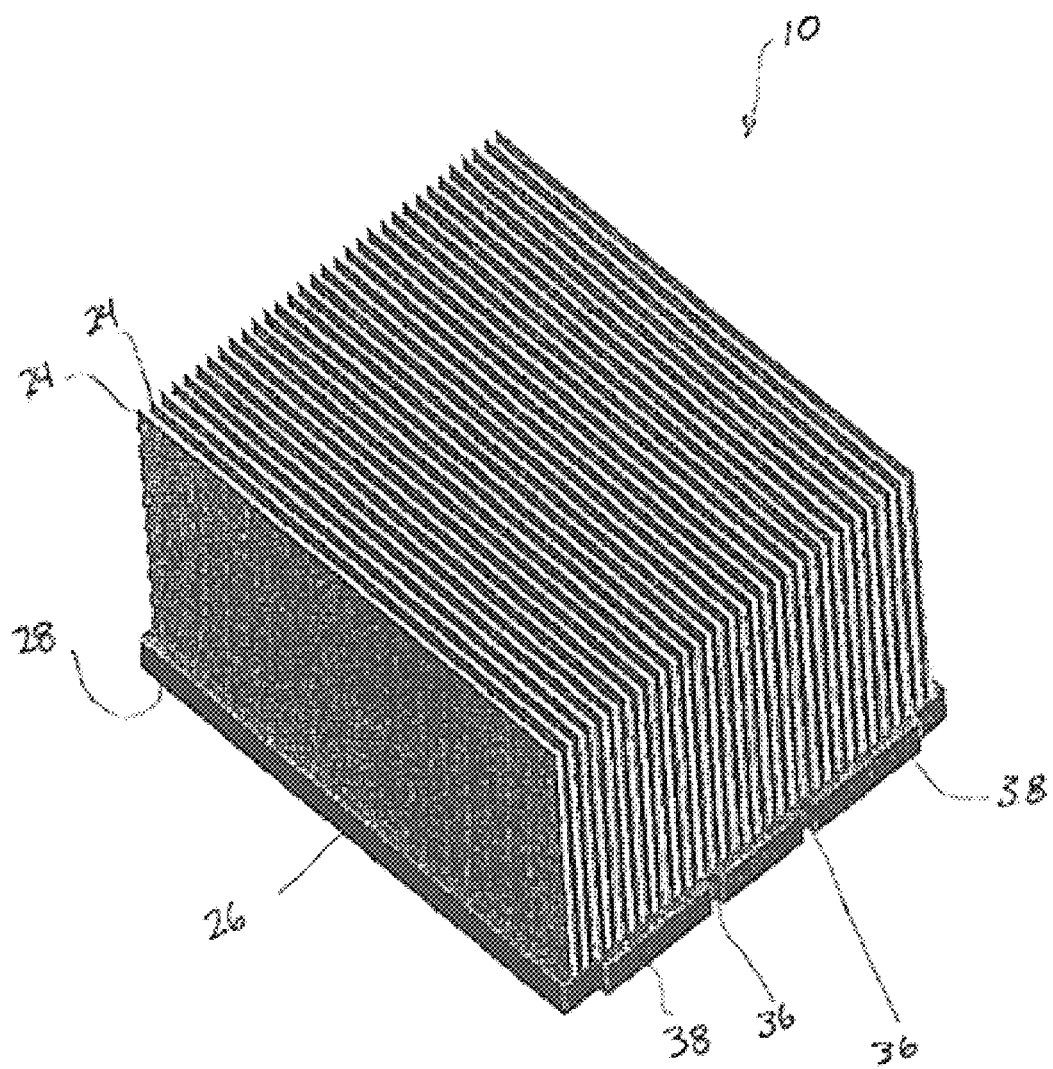
FIG. 6 is a perspective view of an exemplary embodiment of the heat sink according to the present invention.

Turning to FIGS. 4, 5, and 6, three, specific components of the present invention are illustrated. FIG. 4 illustrates a first embodiment of the support structure of the present invention. In this embodiment, the support structure is a frame 70 having a pair of parallel rails 72. A pair of parallel legs 74 connect the rails 72, creating a rectangular frame 70. Each rail 72 has a pair of feet 76, with holes 78 disposed in the feet 76. The holes 78 receive fasteners (screws, bolts, or the like) to mechanically affix the frame 70 to the circuit board 14. In a second embodiment of the support structure, the legs 74 can be omitted.

Figure 8:
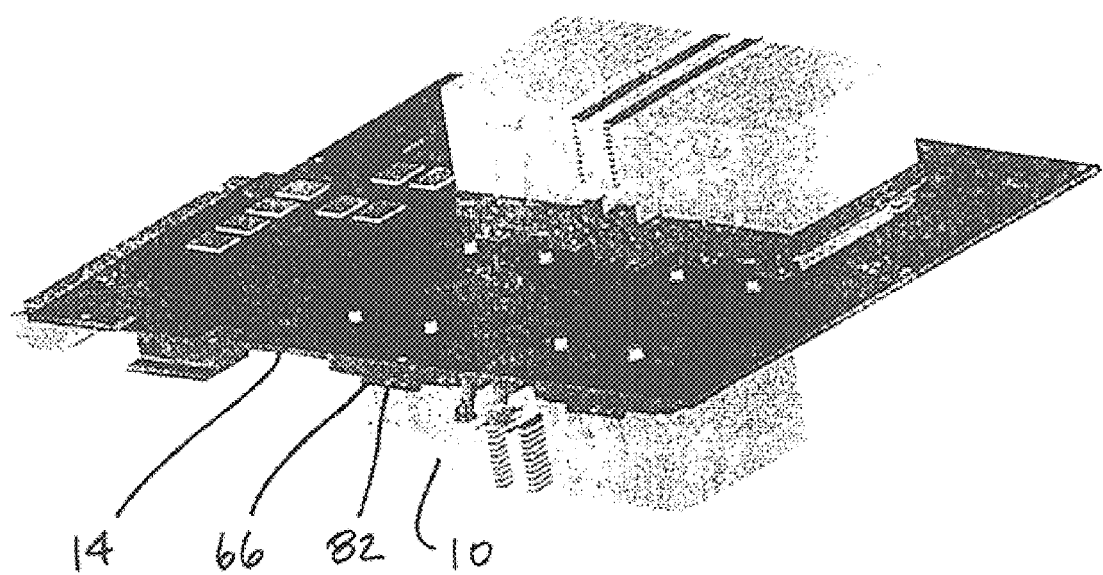
FIG. 8 illustrates an embodiment of the present invention in which one pair of relatively short rails forms a separate support structure for each individual processor.

In either of the first two alternative embodiments of the support structure, one pair of short rails 72 is provided for each processor 50. This configuration is illustrated in FIG. 8. These embodiments sacrifice the advantage of stiffening (achieved by the third embodiment discussed below) of the circuit board 14 but increase flexibility: the support structure can be used on circuit boards 14 with processors 50 in different orientations and on different sides of the circuit board 14 (as shown in FIG. 8). While the circuit board assembly illustrated in FIG. 8 has heat sinks mounted to both sides of the circuit board, the heat sinks can be mounted on one or both sides of the board according to embodiments within the scope of this invention.

Figure 9:
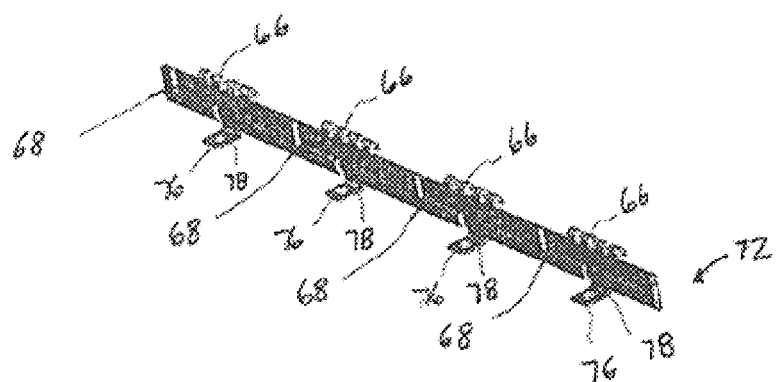
FIG. 9 illustrates another embodiment of the rails of the support structure of the present invention in which the rails are configured to bridge all of the processors in one line on the circuit board.
Figure 10:
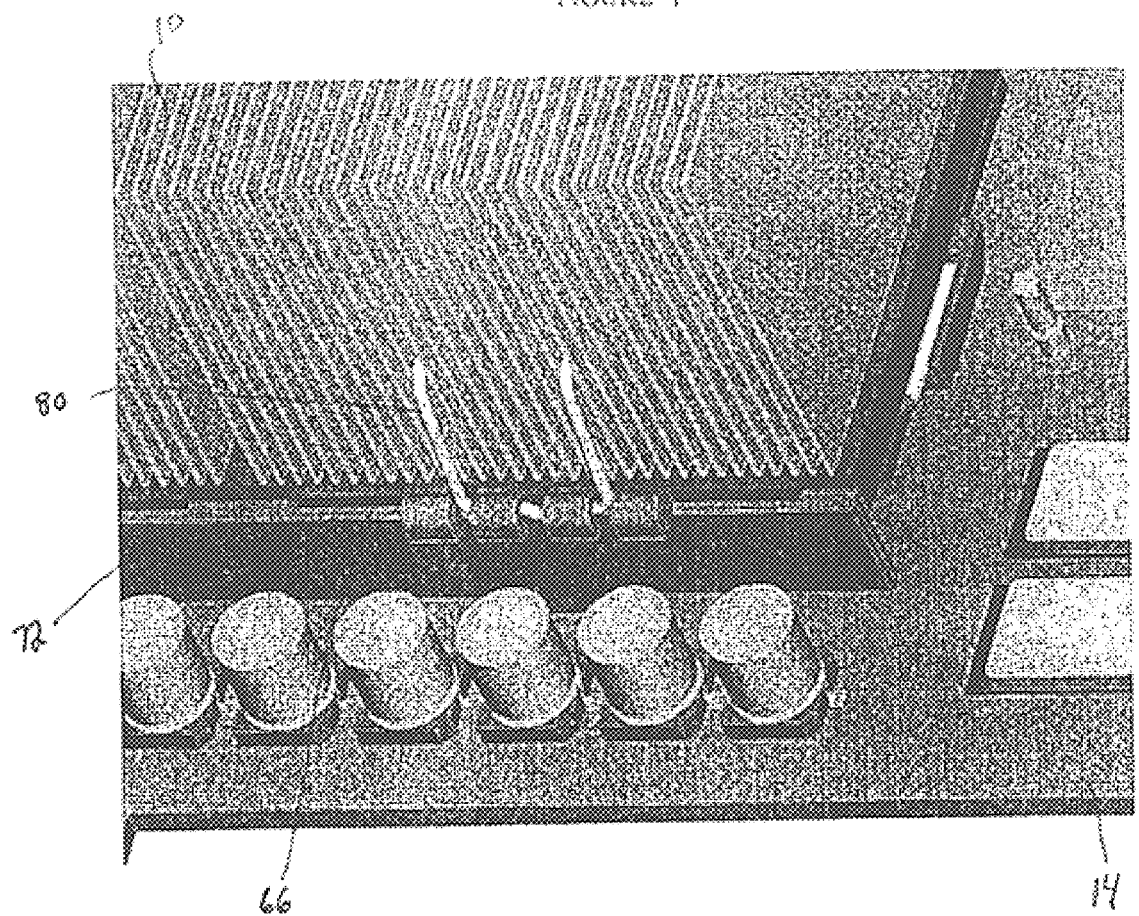
FIG. 10 is a partial perspective view of the rails of the support structure shown in FIG. 9, highlighting use of the rails and the spring clip to retain the heat sink.
Figure 11:
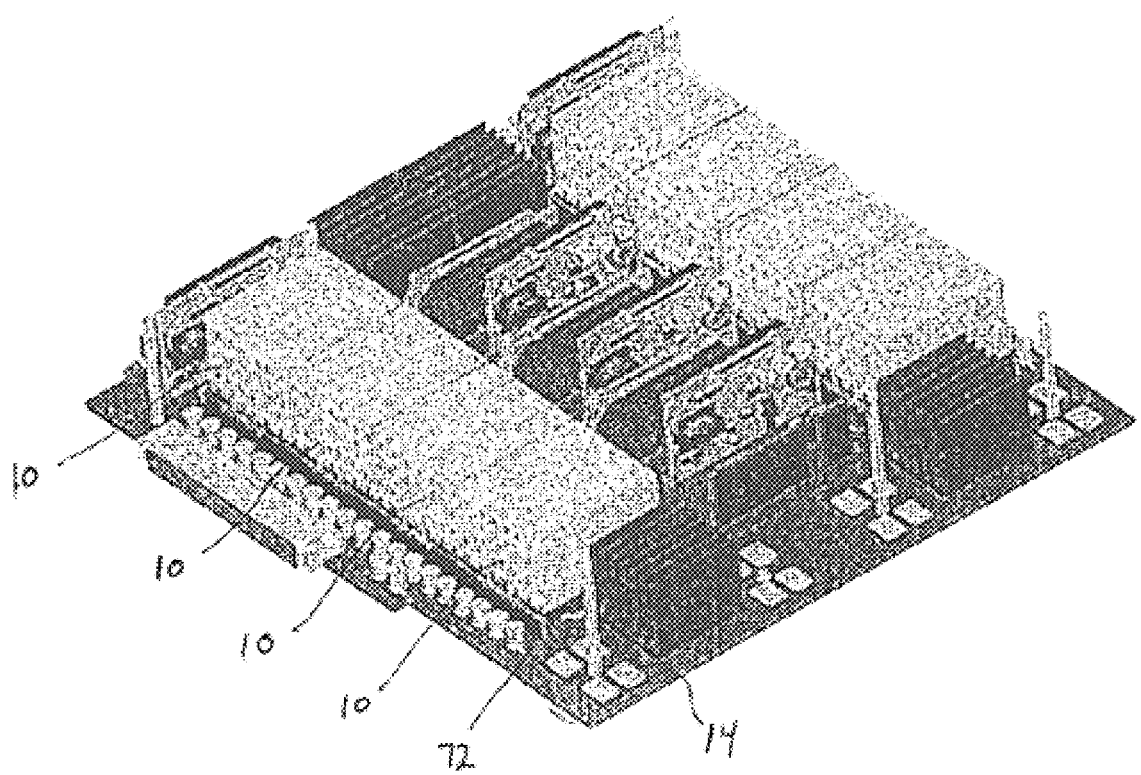
FIG. 11 is a perspective view of the assembly, with the rails of the support structure bridging all four of the processors in one line on the circuit board, according to the present invention.

According to a third, exemplary embodiment of the invention, the support structure includes two opposing rails 72. These rails 72 are illustrated in FIG. 9. The rails 72 bridge all of the processors in one line on the circuit board 14 providing stiffness to the circuit board 14 otherwise unavailable when each heat sink 10 is retained individually (as in the first two embodiments of the support structure). This configuration is illustrated in FIGS. 10 and 11. Such stiffness minimizes the risk of bending of the circuit board 14. In addition, the bridging rails 72 save space on the circuit board 14 as compared to separate rails 72 for each processor 50.

The embodiment of the invention illustrated in FIG. 11 shows a structure for each group of electronic packages which consists of two rails 72, four heat sinks 10, four clip springs 80, four thermal pads 60, and eight fasteners such as screws 42. The number of electronic packages served by this structure can vary as needed. Thus, the structure meets the requirement of a single circuit board 14 with eight processors 50 on two buses. Each bus has four processors 50 and one supporting Application-Specific integrated Circuit or ASIC—all on the same side of the circuit board 14 and all in line. The structure also meets the requirement that the processors 50 be more tightly spaced than on conventional systems and also be orientated with the air flow perpendicular (i.e., at ninety degrees) to the bus whereas in conventional systems the air flow was oriented along the length of the bus. These two requirements make the use of previous heat sinks 10 and retention solutions impractical. The solution offered by the present invention, however, meets these requirements.

Both rails 72 are identical, fostering economy and minimizing the number of different parts. Each rail 72 has one or more pockets 68 formed in the surface of the rail 72 that faces the heat sink 10. The pockets 68 are illustrated, for example, in FIG. 9. Regardless of the embodiment of the support structure, the rails 72 have a plurality of catches 66.

The rails 72 are preferably made of sheet metal. Such material of construction provides several advantages for systems requiring low quantities. Initial tooling costs are low. Manufacturing turn around is fast. Moreover, rails 72 formed of sheet metal have some flexibility, which provides intimate contact between the rails 72 and the corresponding heat sinks 10. Of course, the rails 72 may be made in other ways or of other materials if production quantities justify the cost of tooling.

The spring clip 80 is an integral, monolithic, one-piece construction. As illustrated in FIG. 5, the spring clip 80 has two U-shaped end hooks 82. The hooks are connected by two V-shaped struts 84. The central apex of each V-shaped strut 84 forms a contact point 86. One of the hooks 82 has a centrally located nose 88. The other hook may have a slit 90, extant because clip 80 is preferably formed from a single piece of approximately twelve-pound spring wire.

The heat sink 10 of the present invention includes a number of conventional features. Specifically, the heat sink has a plurality of fins 24 affixed to a pedestal 26. The pedestal 26 is substantially rectangular in shape, having opposing ends and sides, a top to which the fins 24 are affixed, and a bottom or mounting surface 28 which contacts the thermal pad 60.

The heat sink 10 of the present invention also includes a number of features that are not conventional. Specifically, the heat sink 10 has one or more alignment protrusions 38. The heat sink 10 also has vertical alignment slots 36 cut in (or, alternatively, marks on) its ends to align the spring clip 80 relative to the heat sink 10.

The pockets 68 of each rail 72 are designed to mate with the corresponding protrusions 38 provided on each end of the heat sink 10. The pockets 68 retain the heat sink 10 in the two directions parallel to the surface of the circuit board 14. The pockets 68 are sufficiently deep that the rails 72 do not restrain the heat sink 10 in the direction perpendicular to the surface of the circuit board 14 when a processor 50 is in position in its socket 30 beneath the heat sink 10. Absent a processor 50 in position, however, the pockets 68 are not so deep that an installed heat sink 10 would contact the empty socket 30. Thus, the pockets 68 allow the heat sink 10 to "float" in the vertical direction while restraining the heat sink 10 in is the horizontal directions, reducing the accuracy needed in construction and assembly of individual components.

The catches 66 on the rails 72 are designed to engage the hooks 82 of the spring clip 80. The spring clip 80 is restrained in all directions by the catches 66 of the rails 72. The nose 88 on one hook 82 helps to align the hook between 20 adjacent catches 66 and to hold hook 82 in position, restricting movement of hook 82 with respect to catches 66. As illustrated in FIG. 9, the feet 76 of the rails 72 (by which the rails 72 are affixed to the circuit board 14) are located proximate the points of contact between the catches 66 and the hooks 82 to minimize bending in the circuit board 14. The alignment slots 36 of the heat sink 10 align the spring clip 80 relative to the heat sink 10.

Figure 7:
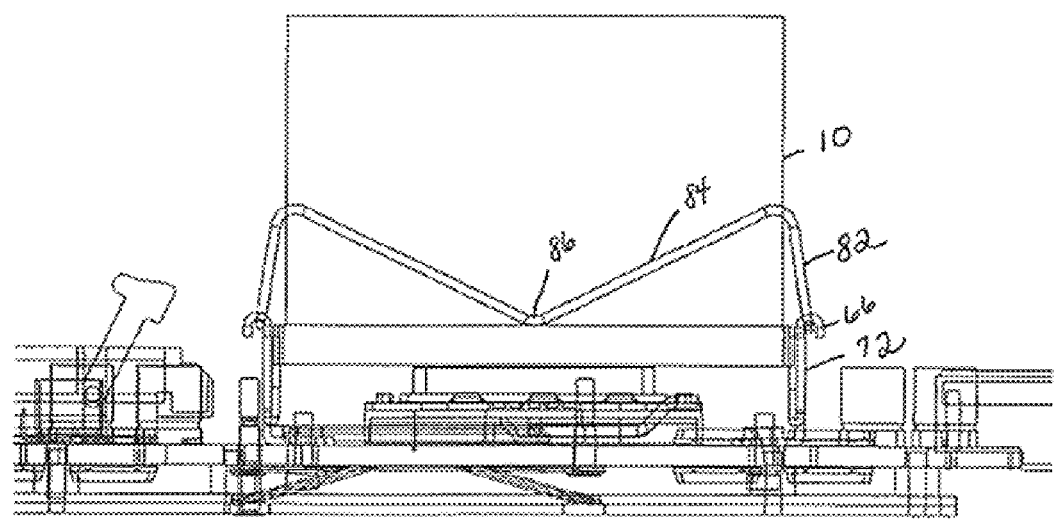
FIG. 7 is a side, transparent view showing the spring clip of FIG. 5 as assembled to the heat sink of FIG. 6 according to the present invention.

The spring clip 80 is shown assembled to the heat sink 10 in FIG. 7. As assembled, the central contact point 86 in each strut 84 of the spring clip 80 contacts the pedestal 26 of the heat sink 10, applying a downward spring force to retain the heat sink 10 against the processor 50. The force is disposed at the center of the package and, therefore, distributed evenly. The spring clip 80 may be designed to provide force on the heat sink 10 by deflection either in bending or in torsion; the preferred version, as illustrated, applies force by bending. Each of the struts 84 of the spring clip 80 fit between adjacent fins 24 of the heat sink 10 without any special modification to the heat sink 10 and the fin-pitch is uninterrupted by the presence of the spring clip 80, which achieves minimal disruption of the air flow through the heat sink 10.

B. Method of Use

Provided below is a step-by-step description of the procedure used to assemble a socket 30, a processor 50, a thermal pad 60, a heat sink 10, and a spring clip 80 of the present invention on a PC-assembly or circuit board 14. The procedure applies equally to a number of different processors 50. Preliminary steps include soldering to the circuit board 14 an appropriate socket 30 for the processor 50 and installing on the circuit board 14 appropriate retention rails 72 for the heat sink 10.

Next, the thermal pad 60 is applied to form the interface between the heat sink 10 and the processor 50. The thermal pad 60 should be placed on the lid of the processor 50. The thermal pad 60 is centered on the processor 50 and then pressed down firmly. Care must be taken to ensure that the thermal pad 60 is smooth and free of voids or lumps. A protective sheet may remain or be placed on the top of the thermal pad 60 until the technician 100 is ready to put the heat sink 10 on the processor 50. This protective sheet will minimize any contamination on the surface of the thermal pad 60.

Figure 12:
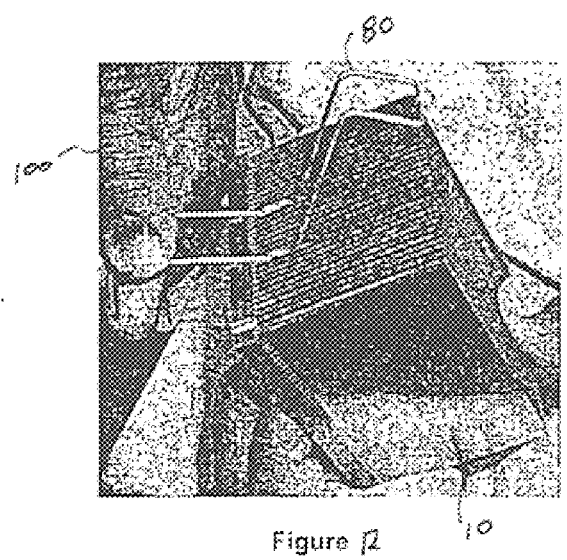
FIG. 12 illustrates an initial step in the procedure used to assemble embodiments of the socket, processor, thermal pad, heat sink, and spring clip of the present invention on a circuit board, specifically placing the hook of the spring clip in the two alignment slots on the heat sink.
Figure 13:
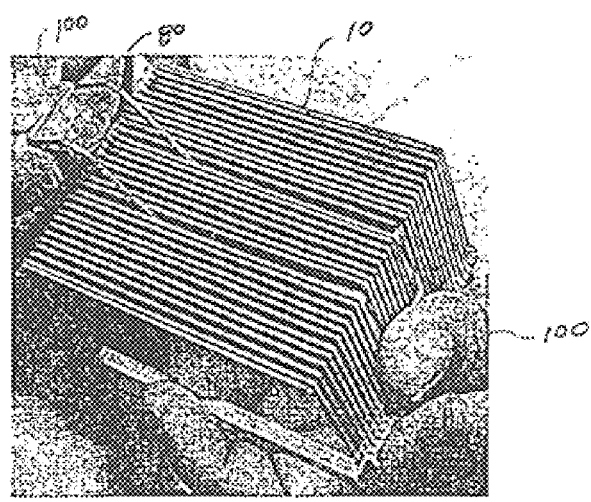
FIG. 13 illustrates another step of the procedure used to assemble the components shown in FIG. 12 in which the technician rocks the spring clip back into the spaces between the fins of the heat sink and slides the spring clip back and up into the fin spaces until an end of the spring clip slips over the corners of the fins.

The technician 100 is now ready to install the spring dip 80 onto the heat sink 10. The heat sink 10 is the same on both ends (i.e., the heat sink 10 is symmetrical). The two alignment slots 36 near the center of the pedestal 26 of the heat sink 10 on each end identify the correct fin-spaces into which the spring clip 80 is to be placed. The two upright portions of one U-shaped hook 82 of the spring clip 80 are placed in these two alignment slots 36 as shown in FIG. 12. The technician 100 then rocks the spring clip 80 back into the spaces between the fins 24; slides the spring clip 80 back and up into the fin-spaces until the end of the spring dip 80 without the slit 90 slips over the corners of the fins 24; and holds the spring clip in the position shown in FIG. 13 in preparation for the next step.

The technician 100 next installs the heat sink 10 and one side of the spring clip 80. Both ends of the pedestal 26 of the heat sink 10 have at least one alignment protrusion 38 that fits into a mating pocket 68 in the retention rail 72. The two hooks 82 of the spring clip 80 differ in that one hook 82 is solid and the other hook 82 is split by the slit 90. The split hook 82 should be installed first on its rail 72, and it should go on the more inaccessible rail 72.

Figure 14:
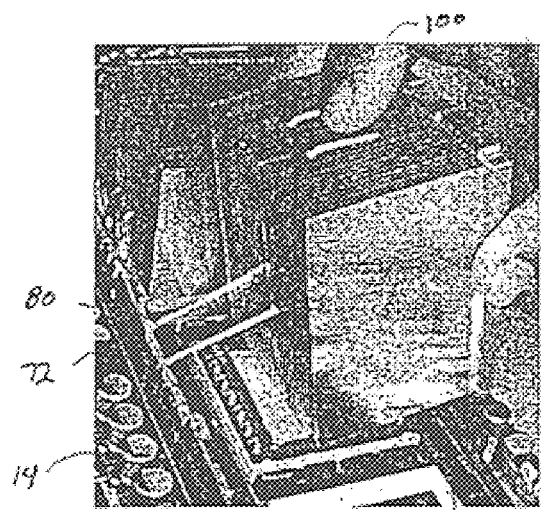
FIG. 14 illustrates another step of the procedure used to assemble the components shown in FIG. 12 in which the technician tips an end of the heat sink down and secures the hook of the spring clip under the catches in the rail of the support structure.
Figure 15:
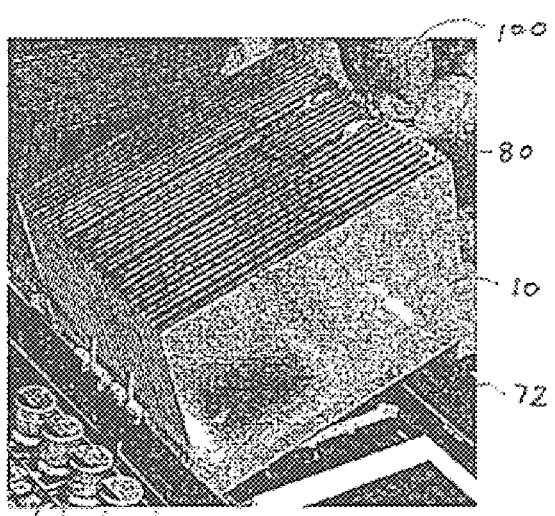
FIG. 15 illustrates another step of the procedure used to assemble the components shown in FIG. 12 in which the two ends of the heat sink are placed in the pockets of the retention rails and the pedestal of the heat sink rests on the thermal pad atop the processor.

As shown in FIG. 14, the technician 100 tips the end of the heat sink 10 down and secures the split hook 82 of the spring clip 80 under the catches 66 in the rail 72. Keeping a light tension on the spring clip 80, the technician 100 rocks the heat sink 10 and spring clip 80 down while rotating upward the lowest end of the heat sink 10. Rotation continues, as shown in FIG. 15, until the two ends of the heat sink 10 sit in the pockets 68 of the retention rails 72 and the pedestal 26 of the heat sink 10 rests on the thermal pad 60 atop the processor 50.

Figure 19:
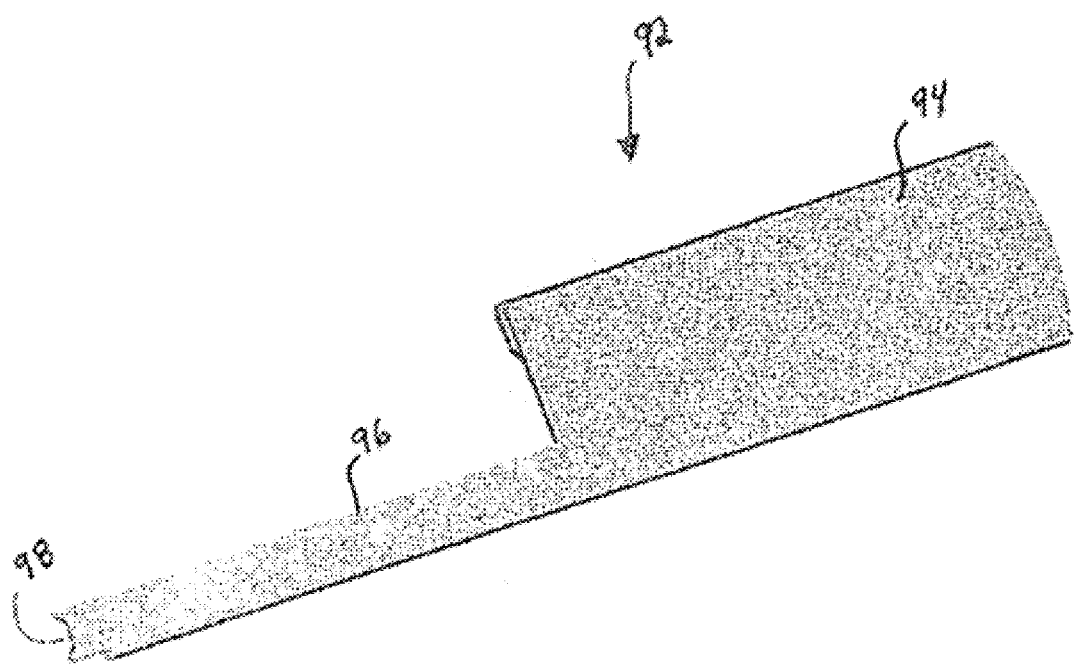
FIG. 19 is a perspective view of an embodiment of a tool used to facilitate installation of the retention structure according to the present invention.

Installation is now ready to be completed. Successful installation is possible, with care, without using any tools. Alternatively, the technician 100 may use a standard tool such as a screwdriver 4 as shown in FIG. 16. The technician 100 may find installation much easier and quicker, however, using the tool 92 shown in FIG. 19. The tool 92 has a body 94, adapted for easy manipulation by the technician 100, and an arm 96 ending in a finger 98 sized to engage the spring clip 80. The tool 92 reduces the likelihood, more prevalent when using either no tools at all or a screwdriver 4, that the technician 100 will slip and damage a component. The tool 92 is conveniently stored in a position on the cover of the circuit board 14.

Regardless of whether the technician 100 uses no tool, a screwdriver 4, or the tool 92, the solid hook 82 of the spring clip 80 is pushed down past the corresponding catches 66 in the rail 72. Such action is illustrated in FIG. 17. Then, without relaxing downward pressure, the solid hook 82 of the spring clip 80 is pushed under the catches 66. Such action is illustrated in FIG. 18. If a screwdriver 4 or tool 92 is used, this action can be accomplished by rotating the screwdriver 4 or tool 92 away from the heat sink 10. Clearly, slippage of the screwdriver 4 off (and, therefore, disengagement from) the spring clip 80 is more likely than for the tool 92 as rotation occurs. Finally, the technician 100 relaxes the downward pressure allowing the solid hook 82 of the spring clip 80 to rise until the catches 66 stop the solid hook 82.

Finally, the technician 100 should inspect the assembly for proper installation. The heat sink 10 should press evenly on the thermal pad 60 and, in turn, on the processor 50. The alignment protrusions 38 on the ends of the heat sink 10 should float in the pockets 68 of the retention rails 72. Upon confirmation of successful installation, the technician 100 may replace the tool 92 into its position on the cover of the circuit board 14 if the tool 92 was used.

The procedure to remove the heat sink 10, typically to eliminate or service the underlying processor 50, is simply the reverse of the assembly procedure described above. Once a hook 82 of the spring clip 80 is released from a corresponding catch 66, the spring clip 80 automatically moves upward and away from the circuit board 14. The same steps are required whether the technician 100 is removing the processor 50 to depopulate the circuit board 14 or to replace the is processor 50 with another processor 50. The replacement may be to upgrade to a higher-performance processor 50 or to replace a presumed defective processor 50.

Although illustrated and described above with reference to certain specific embodiments, the present invention is nevertheless not intended to be limited to the details shown. Rather, various modifications may be made in the details within the scope and range of equivalents of the claims and without departing from the spirit of the invention. For example, the order of the various steps of the method of using the structure of the present invention may be altered.

What is claimed:

1. A structure for removing heat from a packaged electronic component, the structure comprising:

a heat sink having a pedestal with opposing ends and a plurality of fins separated by spaces and disposed on the pedestal, the heat sink dissipating heat generated by the packaged electronic component;

parallel rails disposed adjacent the opposing ends of the pedestal of the heat sink, each rail having a catch; and a spring clip having (a) end hooks which engage the catches on the rails to retain the spring clip on the rails and (b) a strut extending between the hooks, fitting into the space between adjacent fins of the heat sink, and including an apex which contacts substantially centrally the pedestal of the heat sink and applies a force pressing the heat sink toward the packaged electronic component, whereby the heat sink is removably attached at least indirectly to the packaged electronic component;

wherein the opposing ends of the pedestal of the heat sink each have at least one alignment protrusion and the rails each have a surface facing the heat sink with at least one pocket, the protrusions on the heat sink engaging the pockets of the rails to retain the heat sink relative to the rails.

2. The structure according to claim 1, wherein the spring clip is integral, monolithic, and one-piece.

3. The structure according to claim 1, wherein the opposing ends of the pedestal of the heat sink each have at least one alignment slot aligning the spring clip with respect to the heat sink.

4. The structure according to claim 1, wherein the rails are made of sheet metal.

5. The structure according to claim 1, wherein the packaged electronic component includes a plurality of aligned processors and the rails bridge all of the aligned processors.

6. The structure according to claim 1, wherein the rails include feet adapted to connect a substrate, the feet located proximate the points of engagement between the catches and the hooks to minimize bending in the substrate.

7. The structure according to claim 1, wherein:
  (a) the spring clip is integral, monolithic, and one-piece; and
  (b) the opposing ends of the pedestal of the heat sink each have at least one alignment slot aligning the spring clip with respect to the heat sink.

8. An electronic package comprising:
  a circuit board;
  a socket affixed to the circuit board;
  a processor fitted in the socket and generating heat;
  a thermal pad engaging the processor and transmitting the heat generated by the processor;
  a heat sink having a pedestal with opposing ends and a plurality of fins separated by spaces and disposed on the pedestal, the heat sink engaging the thermal pad and dissipating the heat generated by the processor and transmitted by the thermal pad; and
  an attachment structure removably attaching the heat sink to the thermal pad, the attachment structure including:
  (a) parallel rails disposed adjacent the opposing ends of the pedestal of the heat sink, each rail having a catch, and
  (b) a spring clip having (i) end hooks which engage the catches on the rails to retain the spring clip on the rails and (ii) a strut extending between the hooks, fitting into the space between adjacent fins of the heat sink, and including an apex which contacts substantially centrally the pedestal of the heat sink and applies a force pressing the heat sink toward the thermal pad;
  wherein the opposing ends of the pedestal of the heat sink each have at least one alignment protrusion and the rails each have a surface facing the heat sink with at least one pocket, the protrusions on the heat sink engaging the pockets of the rails to retain the heat sink relative to the rails.

9. The electronic package according to claim 8, wherein the spring clip is integral, monolithic, and one-piece.

10. The electronic package according to claim 8, wherein the opposing ends of the pedestal of the heat sink each have at least one alignment slot aligning the spring clip with respect to the heat sink.

11. The electronic package according to claim 8, wherein the rails are made of sheet metal.

12. The electronic package according to claim 8 wherein the electronic package comprises a plurality of aligned processors and the rails bridge all of the aligned processors.

13. The electronic package according to claim 8, wherein the rails include feet engaging the circuit board, the feet located proximate the points of engagement between the catches and the hooks to minimize bending in the circuit board.

14. The electronic package according to claim 8, wherein;
  (a) the spring clip is integral, monolithic, and one-piece; and
  (b) the opposing ends of the pedestal of the he at sink each have at least one alignment slot aligning the spring clip with respect to the heat sink.

15. A method of removably attaching a heat sink to a packaged electronic component so that the heat sink dissipates heat generated by the packaged electronic component, the heat sink having a pedestal with opposing ends and a plurality of fins separated by spaces and disposed on the pedestal, the method comprising:
  arranging parallel rails adjacent the opposing ends of the pedestal of the heat sink, each rail having a catch;
  placing an alignment protrusion on a first of the opposing ends of the pedestal of the heat sink into a corresponding pocket in a first of the parallel rails; and
  installing a spring clip having (a) end hooks which engage the catches on the rails to retain the spring clip on the rails and (b) a strut extending between the hooks, fitting into the space between adjacent fins of the heat sink, and including an apex which contacts substantially centrally the pedestal of the heat sink and applies a force pressing the heat sink toward the packaged electronic component, whereby the heat sink is removably attached at least indirectly to the packaged electronic component.

16. The method according to claim 15, wherein the step of installing the spring clip comprises:
  aligning a first of the end hooks of the spring clip with a corresponding alignment slot on the pedestal of the heat sink;
  sliding the spring clip into the spaces between the fins of the heat sink;
  securing the first end hook of the spring clip to a corresponding catch of the first of the rails;
  maintaining a light tension on the spring clip while rotating the heat sink and spring clip until the alignment protrusion on a second of the opposing ends of the pedestal of the heat sink enters into the corresponding pocket in a second of the parallel rails and the pedestal of the heat sink rests at least indirectly on the packaged electronic component; and
  forcing a second of the end hooks of the spring clip into engagement with a corresponding catch of the second of the rails.

17. A heat sink assembly comprising:
  a heat sink having a pedestal with opposing ends and adjacent fins disposed on the pedestal;
  rails disposed adjacent the opposing ends of the pedestal of the heat sink, each rail having a catch; and
  a spring clip having (a) end hooks which engage the catches on the rails and (b) a strut extending between the hooks and fitting between the adjacent fins of the heat sink, and including an apex which contacts substantially centrally the pedestal of the heat sink and applies a force thereto,
  wherein the opposing ends of the pedestal of the heat sink each have at least one alignment protrusion and the rails each have a surface facing the heat sink with at least one pocket, the protrusions on the heat sink engaging the pockets of the rails to retain the heat sink relative to the rails.

18. A method of removably attaching a heat sink to a packaged electronic component so that the heat sink dissipates heat generated by the packaged electronic component, the method comprising:

arranging parallel rails adjacent opposing ends of a pedestal of the heat sink, each rail having a catch;

placing an alignment protrusion on a first end of the pedestal of the heat sink into a corresponding pocket in at least one of the rails:

engaging end hooks of a spring clip to the catches;

extending a strut of the spring clip between the hooks and adjacent fins of the heat sink; and contacting an apex of the strut of the spring clip to a central portion of the pedestal of the heat sink, thereby applying a force pressing the heat sink toward the packaged electronic component, whereby the heat sink is removably attached at least indirectly to the packaged electronic component.

* * * * *